United States Patent [19]

Dombrowski

[11] 4,295,226
[45] Oct. 13, 1981

[54] HIGH SPEED DRIVER FOR OPTOELECTRONIC DEVICES

[75] Inventor: Leonard C. Dombrowski, Batavia, Ill.

[73] Assignee: Bell Telephone Laboratories, Incorporated, Murray Hill, N.J.

[21] Appl. No.: 165,380

[22] Filed: Jul. 2, 1980

[51] Int. Cl.³ .............................................. H04B 9/00
[52] U.S. Cl. ..................... 455/618; 455/608; 455/611; 455/613; 455/602; 250/551; 250/552
[58] Field of Search ............... 455/608, 611, 613, 618, 455/602; 250/551, 552

[56] References Cited

U.S. PATENT DOCUMENTS

| 2,981,850 | 4/1961 | Hoskinson | 307/293 |
|---|---|---|---|
| 3,902,060 | 8/1975 | Neuner | 455/608 |
| 4,009,385 | 2/1977 | Sell | 455/611 |
| 4,166,947 | 9/1979 | Dirksen | 455/612 |

OTHER PUBLICATIONS

*AFSC Multiplex Data Bus Conference*, "A MIL-STD-1553 Fiber Optic Data Bus", Nov. 1976.
*Electronic Design*, "Drive Fiber-Optic Lines at 100 MHz", Jul. 19, 1974, pp. 96–99.

*Primary Examiner*—Howard Britton
*Attorney, Agent, or Firm*—Jerry W. Herndon

[57] ABSTRACT

A driver circuit for a unidirectional optoelectronic device is disclosed, which circuit is arranged to improve the fall time characteristic of the optical output of the device. The circuit controls the device to draw a non-zero current when the device is in an "off" state and a larger current when the device is in an "on" state. The circuit controls the current through the device such that the current is momentarily reduced to an amount less than the "off" current during a transition from the "on" to "off" states, thus effectively simulating a negative current overdrive otherwise impossible through such a unidirectional device.

7 Claims, 2 Drawing Figures

HIGH SPEED DRIVER FOR OPTOELECTRONIC DEVICES

TECHNICAL FIELD

This invention pertains to unidirectional electronic optical generating devices, such as light emitting diodes (LEDs), and to circuits and techniques for improving the response time of same. Particularly, the invention pertains to a drive circuit for improving the fall time characteristic of such devices.

BACKGROUND OF THE INVENTION

As optoelectronic devices become more important, particularly in the data processing and data transmission areas, the need to maximize the speed at which these devices may be operated becomes increasingly important. Considerable attention has been given to improving the overall operating speed of optoelectronic devices and data systems as a whole. For example, a lengthy discussion of data rate enhancement for optoisolator transmission systems is given in *Optoelectronics Applications Manual;* Hewlett-Packard Company; Section 3.6.3. The discussion includes a technique of voltage biasing an LED which terminates a transmission line to improve the overall response time.

As another example, U.S. Pat. No. 3,902,060, which issued to J. A. Neuner et al on Aug. 26, 1975, describes a light responsive circuit having a non-linear negative feedback unit which improves several characteristics of photo-coupled data transmission systems including overall response time.

Less emphasis has been placed on directly improving the rise and fall time response of the optoelectronic light generating devices themselves by circuit means. FIG. 7a of the aforementioned U.S. Pat. No. 3,902,060, however, discloses a drive circuit for an LED which overdrives the leading edge of a current pulse to an LED. This improves the rise time of the LED by rapidly charging the junction depletion region of the LED. This overdriving technique cannot be used, however, to improve the fall time characteristic of devices such as LEDs because of this unidirectional nature.

U.S. Pat. No. 4,166,947, which issued to J. P. Dirksen on Sept. 4, 1979 is illustrative of techniques conventionally used to improve the fall time of such devices. This patent discloses shunting an LED in response to a turn-off signal to provide a low impedance path for the elimination of minority carriers in the device. A need exists, however, to further improve the fall time characteristic of optoelectronic devices.

SUMMARY OF THE INVENTION

An improvement is obtained in the fall time characteristic of unidirectional optoelectronic devices and a technical advance is achieved in a driver circuit arranged to bias the device to draw a first prescribed steady-state current greater than zero when the device is in a first state and a second prescribed steady-state current greater than the first prescribed current when the device is in a second state. The circuit is arranged to control the current drawn by the device such that the current is momentarily reduced to a value less than the first prescribed current during a transition from the second state to the first state, thereby simulating a negative current overdrive through the unidirectional device.

In the preferred embodiment, the circuit is used to drive a light emitting diode (LED). The LED generates different levels of optical output at both of its operating states. In order to discriminate between the two optical states, a voltage threshold detector is connected to a photodiode which, in turn, senses the optical output of the LED. The arrangement allows the effective overdriving of current through the LED in the reverse, or negative direction, which is otherwise impossible because of its unidirectional nature. This overdriving aids the sweeping of minority carriers out of the junction region of the LED and thereby improves the fall time of the LED optical output.

DETAILED DESCRIPTION

Figure 1:
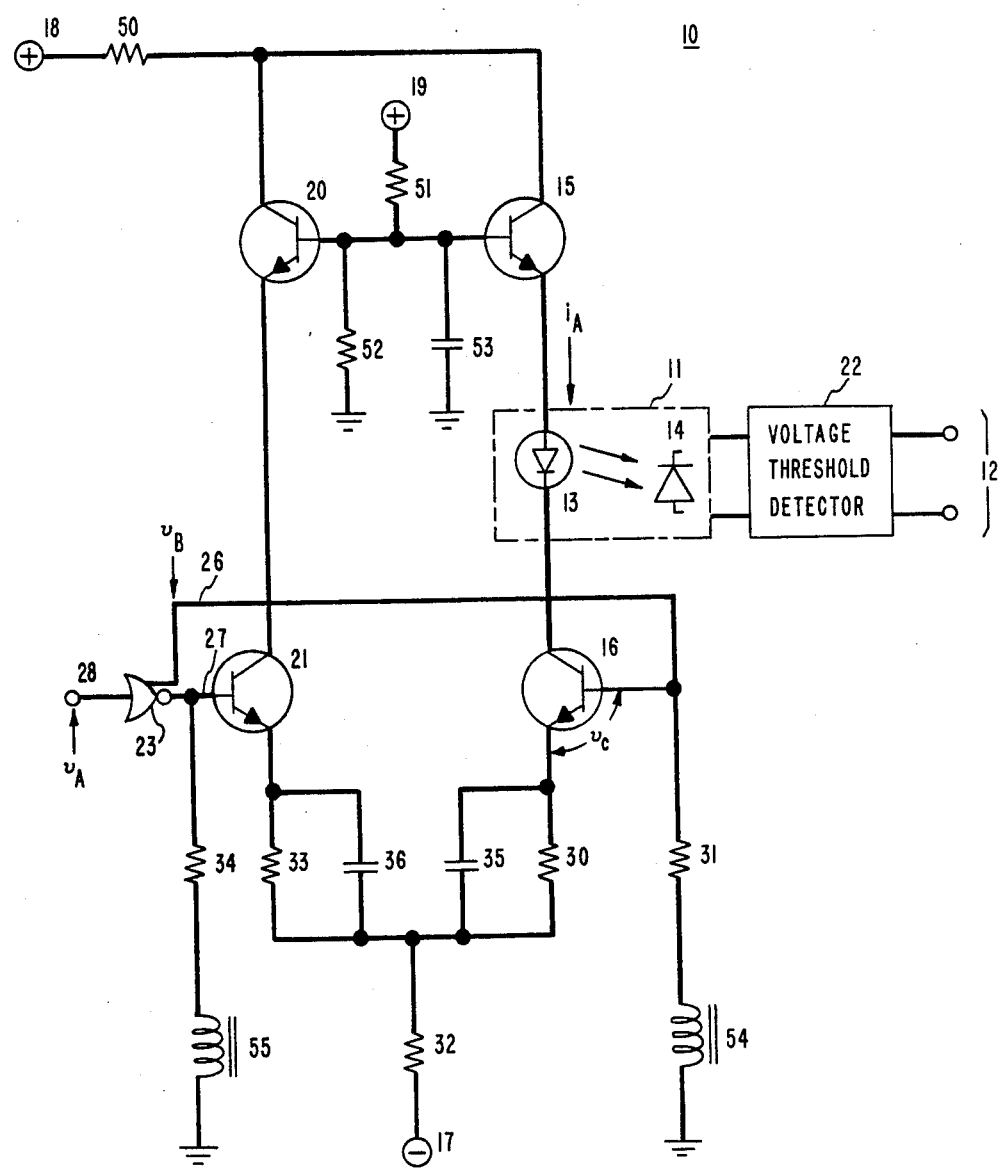
FIG. 1 is a schematic of the preferred embodiment of the drive circuit.

The circuit of FIG. 1 shows, by way of example, a circuit 10 for driving an optoelectronic isolator 11. Circuit 10 might, for example, terminate a transmission line in a situation in which it is desired to electrically isolate the transmission line from a utilization circuit (not shown) connected to output terminal 12. The electrical isolation is performed by LED 13 and photodiode 14 contained within the isolation circuit 11. Circuit 10 might be used, however, in numerous other applications for driving optoelectronic devices. It might drive an LED which couples light to an optical fiber, for example.

The circuit of FIG. 1 illustratively has two essentially identical branches, one containing transistors 15 and 16 and the other containing transistors 20 and 21. Transistors 15 and 20, and the associated components comprising voltage sources 18, 19; resistor 50 through 52 and capacitor 53 operate in an obvious manner to supply current to the two circuit branches. As seen, the branch containing transistor 15 also contains the driven LED 13. When this branch is "on" (in one current state), the other branch is "off" (in another current state), and vice versa. This causes the current drawn by the circuit to be essentially constant whether the LED is "off" or "on". This, in turn, reduces noise transients caused by large current shifts in the current drawn from the power supply, and aids in turning transistors 16 and 21 off and on in response to input signal transitions.

Circuit 10 is arranged such that an "off" branch draws a prescribed steady-state current, here chosen to be approximately 28 milliamperes (ma) and an "on" branch draws another prescribed steady-state current illustratively chosen to be approximately 82 ma. The nonzero "off" current improves the optical rise time response of LED 13 by reducing the delay time required to initiate current through the LED.

Because both "on" and "off" states of LED 13 draw current, both states result in a certain level of light coupled to photodiode 14. The difference in light intensity between the two states results in different output voltages from isolation circuit 11. Accordingly, a voltage threshold detector 22 is used to monitor the output of the isolation circuit to distinguish between the two states. Detector 22 might, for example, be a differential line receiver circuit such as a 10116, manufactured by Motorola for example, in which the signal input from LED 14 is AC coupled and a second input is coupled to ground potential.

Figure 2:
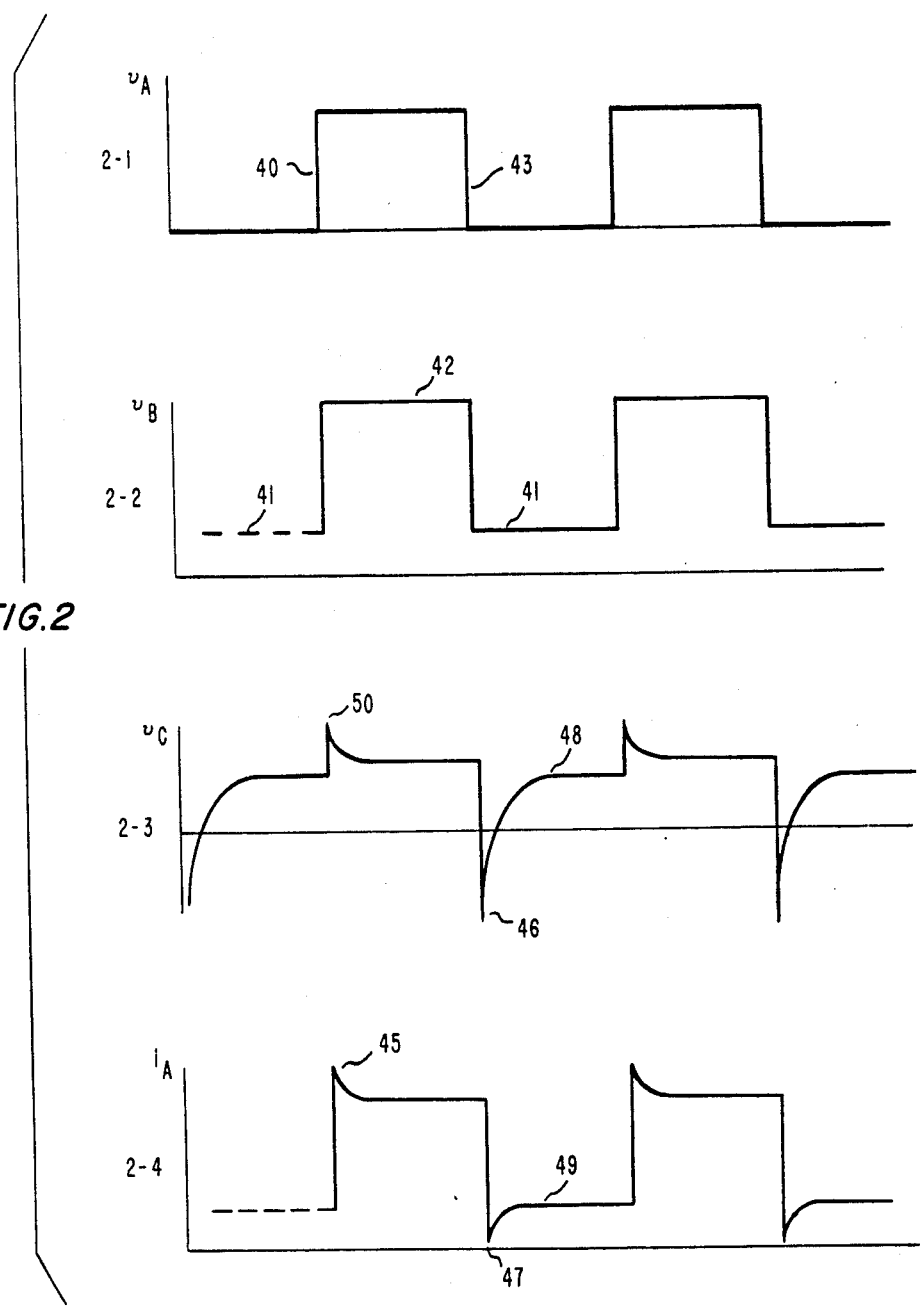
FIG. 2 illustrates current and voltage waveforms at selected points in the schematic.

With reference to FIG. 2, waveform 2-1 shows an illustrative input voltage signal $v_A$ which is the input to NOR logic gate 23 of circuit 10. Logic gate 23 produces an output signal $v_B$, shown in FIG. 2—2, on lead 26. This signal drives the base of transistor 16. Logic gate 23 also produces an inverted version of signal $v_B$ on lead 27 which drives the base of transistor 21. The networks consisting, respectively, of resistor 31 and inductor 54, and resistor 34 and inductor 55, operate to peak the output signals from NOR gate 23 which drive the base junctions of transistor 16 and 21.

Circuit 10 is designed such that LED 13 is "off" when voltage level 41 in FIG. 2—2 is present on lead 26, and "on" when voltage level 42 is present. Voltage level 41 is illustratively chosen to be approximately 0.3 volts in the preferred embodiment. Voltage level 42 is illustratively chosen to be approximately 1.2 volts.

When no input pulse is present, voltage level 41 is present at the base of transistor 16. Resistors 30 through 32 and voltage source 17 are chosen such that transistor 16 draws the illustrative steady-state "off" current of 28 ma. Resistors 33 and 34, and resistor 32 cause transistor -1 to draw the illustrative steady-state "on" current of 82 ma. Capacitors 35 and 36 are charged to different voltages which are equal, respectively, to the voltage drops across resistors 30 and 33. When the input signal goes from low to high, such as shown at 40 in FIG. 2—1, the base of transistor 16 is raised to the voltage level 42 in FIG. 2—2. The voltage across capacitor 35 cannot change instantly in response to the increased base voltage. Therefore, the voltage across the base-emitter junction of transistor 16 increases momentarily as shown at 50 in FIG. 2—3 and thereafter drops to its new steady-state value 44 as capacitor 35 charges to a new quiescent voltage. As shown at 45 in FIG. 2—4, the LED 13 current supplied by transistor 16 also increases momentarily in synchronism with the base-emitter voltage. This positive current overdriving aids the turn-on response time of LED 13 by rapidly charging its junction depletion layer.

When the input signal has a transition from a high to a low state as at 43 in FIG. 2—1, the base of transistor 16 is reduced to the voltage at level 41 in FIG. 2—2. Again, since the voltage across capacitor 35 can't change instantly, the immediate base-emitter voltage responsive to the input signal change is determined by the voltage measured from the base of transistor 16 to ground, which is level 41 of the input signal, plus the supply voltage 17, minus the voltage across resistor 32, and finally, minus the voltage across capacitor 35 present immediately before the change in the input signal. The circuit components are selected such that this initial base-emitter voltage is driven negative, such as shown at 46 in FIG. 2—3, in the preferred embodiment. As a result, transistor 16 is turned-off and the current through LED 13 is reduced to zero as shown at 47 in FIG. 2—4.

Immediately after the input signal has changed to a low state, the voltage across capacitor 35 begins to discharge through resistor 30 toward a new quiescent state. As a result, the base-emitter voltage of transistor 16 increases from its negative level 46 toward a steady-state level 48 shown in FIG. 2—3. Base-emitter voltage level 48 is selected such that transistor 16 turns-on slightly and draws the collector current shown at level 49 in FIG. 2—4.

Thus, in response to the high to low input signal transition, the current through LED 13 is momentarily reduced to zero and then allowed to rise shortly thereafter to a steady-state "off" state. This produces the equivalent benefits as if the LED 13 were negatively overdriven during turn-off, although LED 13 cannot be negatively overdriven because of its unidirectional nature.

In the exemplary embodiment of FIG. 1, transistors 15, 16, 20 and 21 are selected according to the power and frequency characteristics desired. They might, for example, be high frequency transistors such as the Fairchild FMT 1090. Voltage sources 17, 18, and 19 are illustratively $-3$, $+12$, and $+12$ volts, respectively. The voltage levels 41 and 42 from logic gate 23 are illustratively 0.3 and 1.2 volts, respectively. Illustrative component values are shown in the following table.

| Resistor | Ohms | Capacitors | Microfarad |
|---|---|---|---|
| 30 | 16.7 | | |
| 31 | 50 | 35 | .000150 |
| 32 | 19 | 36 | .000571 |
| 33 | 16.7 | 53 | 1 |
| 34 | 50 | | |
| 50 | 30 | | |
| 51 | 65 | | |
| 52 | 55 | | |

It is to be understood that the above-described arrangement is merely illustrative of the application of the principles of the invention, and that other arrangements may be devised by those skilled in the art without departing from the spirit and scope of the invention.

I claim:

1. A high speed driver for a unidirectional optoelectronic device (13), characterized by
    means (16, 30, 31, 32) for biasing the device to draw a first prescribed steady-state current greater than zero when the device is in a first state and a second prescribed steady-state current greater than the first prescribed current when the device is in a second state, and
    means (35) for controlling the biasing means to cause the current drawn by the device momentarily to be a value less than that of the first prescribed current during a transition of the device from the second to the first state, thereby to simulate a negative current overdrive through the unidirectional drive.

2. The invention of claim 1 in which said biasing means comprises a switching transistor (16) connected to the optoelectronic device, and
    an impedance network (30) connected to the transistor and to the controlling means, and said driver further comprises
    input means (23) operative to control the operation of the transistor responsive to input signals, wherein the controlling means and the impedance network cooperatively momentarily negative-bias the transistor in response to a control signal from the input means requesting a transition from the second to the first state.

3. The invention of claim 2 in which the optoelectronic device is connected to a first electrode of the transistor, a first terminal of the impedance network is connected to a second electrode of the transistor, and the input means is connected to a third control electrode of the transistor.

4. The invention of claim 3 in which the impedance network comprises a resistor and the controlling means comprises a capacitor connected in parallel with the resistor.

5. The invention of claim 4 further comprising a second transistor (15) for supplying current to the optoelectronic device.

6. The invention of claim 1 further comprising a light responsive device (14) for generating a voltage output in accordance with the intensity of the optical output from the optoelectronic device, and a voltage threshold detector for identifying the first and second states of the optoelectronic device according to the respective optical output intensities of those states.

7. The invention of claim 1 in which the optoelectronic device comprises a light emitting diode.

* * * * *